United States Patent
Koo et al.

(10) Patent No.: US 10,930,322 B2
(45) Date of Patent: Feb. 23, 2021

(54) REGULATOR AND MEMORY DEVICE HAVING THE SAME

(71) Applicant: SK hynix Inc., Gyeonggi-do (KR)

(72) Inventors: Bon Kwang Koo, Gyeonggi-do (KR); Chi Hyun Kim, Seoul (KR); Kyu Tae Park, Gyeonggi-do (KR); Tei Cho, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/736,968

(22) Filed: Jan. 8, 2020

(65) Prior Publication Data

US 2020/0365193 A1 Nov. 19, 2020

(30) Foreign Application Priority Data

May 14, 2019 (KR) .................. 10-2019-0056600

(51) Int. Cl.
*G11C 5/14* (2006.01)
*G05F 1/56* (2006.01)
*H03K 5/24* (2006.01)

(52) U.S. Cl.
CPC .............. *G11C 5/147* (2013.01); *G05F 1/56* (2013.01); *H03K 5/24* (2013.01)

(58) Field of Classification Search
CPC ........................................... G11C 5/14
USPC ..................................... 365/189.09
See application file for complete search history.

(56) References Cited

U.S. PATENT DOCUMENTS 9,013,932 B1 * 4/2015 Lee .................. G11C 11/40626
365/189.09

FOREIGN PATENT DOCUMENTS

KR 10-0816159 3/2008
KR 10-2014-0074551 6/2014

* cited by examiner

*Primary Examiner* — Jason Lappas
(74) *Attorney, Agent, or Firm* — IP & T Group LLP

(57) ABSTRACT

A regulator having improved voltage control capability may include a comparator, an output voltage generator, a voltage divider, and an output voltage controller. The comparator generates a comparison voltage by comparing a reference voltage with a feedback voltage. The output voltage generator generates an output voltage by using a power supply voltage, based on the comparison voltage. The voltage divider may include a first resistor and a second resistor, which generate the feedback voltage by dividing the output voltage. The output voltage controller adjusts a resistance value of at least one of the first resistor and the second resistor, based on a result of comparing the output voltage with a target voltage.

20 Claims, 4 Drawing Sheets

REGULATOR AND MEMORY DEVICE HAVING THE SAME

CROSS-REFERENCE TO RELATED APPLICATION

The present application claims priority under 35 U.S.C. § 119(a) to Korean patent application number 10-2019-0056600 filed on May 14, 2019, which is incorporated herein by reference in its entirety.

BACKGROUND

1. Field of Invention

The present disclosure generally relates generally to an electronic device, and more particularly, to a regulator and a memory device having the same.

2. Description of Related Art

A storage device may store data under the control of a host device such as a computer or a smart phone. The storage device may is include a memory device for storing data and a memory controller for controlling the memory device. Memory devices may be classified into volatile and non-volatile memory devices.

Typically, a memory device may include a voltage generator configured to generate an operating voltage having a constant level from a power supply voltage so as to achieve a stable operation of the memory device. The voltage generator may include a regulator which constantly maintains an operating voltage to a target level. The regulator may control the operating voltage to match a target voltage by using a negative feedback method.

SUMMARY

Embodiments of the present invention are directed to a regulator having improved voltage control capability and also to a memory device including the regulator.

In accordance with an aspect of the present disclosure, there is provided a regulator including: a comparator configured to generate a comparison voltage by comparing a reference voltage with a feedback voltage; an output voltage generator configured to generate an output voltage by using a power supply voltage, based on the comparison voltage; a voltage divider including a first resistor and a second resistor, which generate the feedback voltage by dividing the output voltage; and an output voltage controller configured to adjust a resistance value of at least one of the first resistor and the second resistor, based on a result of comparing the output voltage with a target voltage.

In accordance with another aspect of the present disclosure, there is provided a memory device including: a memory cell array having a plurality of memory cells; a peripheral circuit configured to perform an operation on the plurality of memory cells; a voltage generator configured to generate an operating voltage for the operation; and a control logic configured to control the peripheral circuit and the voltage generator, wherein the voltage generator includes a regulator configured to generate the operating voltage by using a power supply voltage, and adjust at least one of a resistance value of a first resistor, which is proportional to a magnitude of the operating voltage, and a resistance value of a second resistor, which is in inverse proportion to an increasing rate of the operating voltage, by comparing the operating voltage with a target voltage.

In accordance with another aspect of the present disclosure, there is provided a circuit comprising: a comparator configured to receive a reference voltage and a feedback voltage, and comparing the reference voltage with the feedback voltage to generate a comparison voltage; an output voltage generator coupled between a terminal of a power supply voltage and an output node, and configured to generate an output voltage using the power supply voltage, in response to the comparison voltage; a voltage divider including a first variable resistor and a second variable resistor which are serially coupled between the output node and a terminal of a ground voltage, and configured to divide the output voltage based on resistance values of the first and second resistors and generating the feedback voltage; and a output voltage controller configured to adjust a resistance value of at least one of the first variable resistor and the second variable resistor based on a result of comparing the output voltage with a target voltage.

BRIEF DESCRIPTION OF THE DRAWINGS

Example embodiments of the present invention will now be described more fully hereinafter with reference to the accompanying drawings; however, it is noted that the present invention may be implemented in different embodiments and should not be construed as being limited only to the embodiments set forth herein. Rather, these embodiments are provided so that the disclosure of the present invention will be thorough and complete to those with ordinary skill in the art to which the present invention belongs or pertains.

It is further noted that the drawings are simplified schematics and that dimensions of certain elements may be exaggerated for clarity of illustration.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

Figure 1:
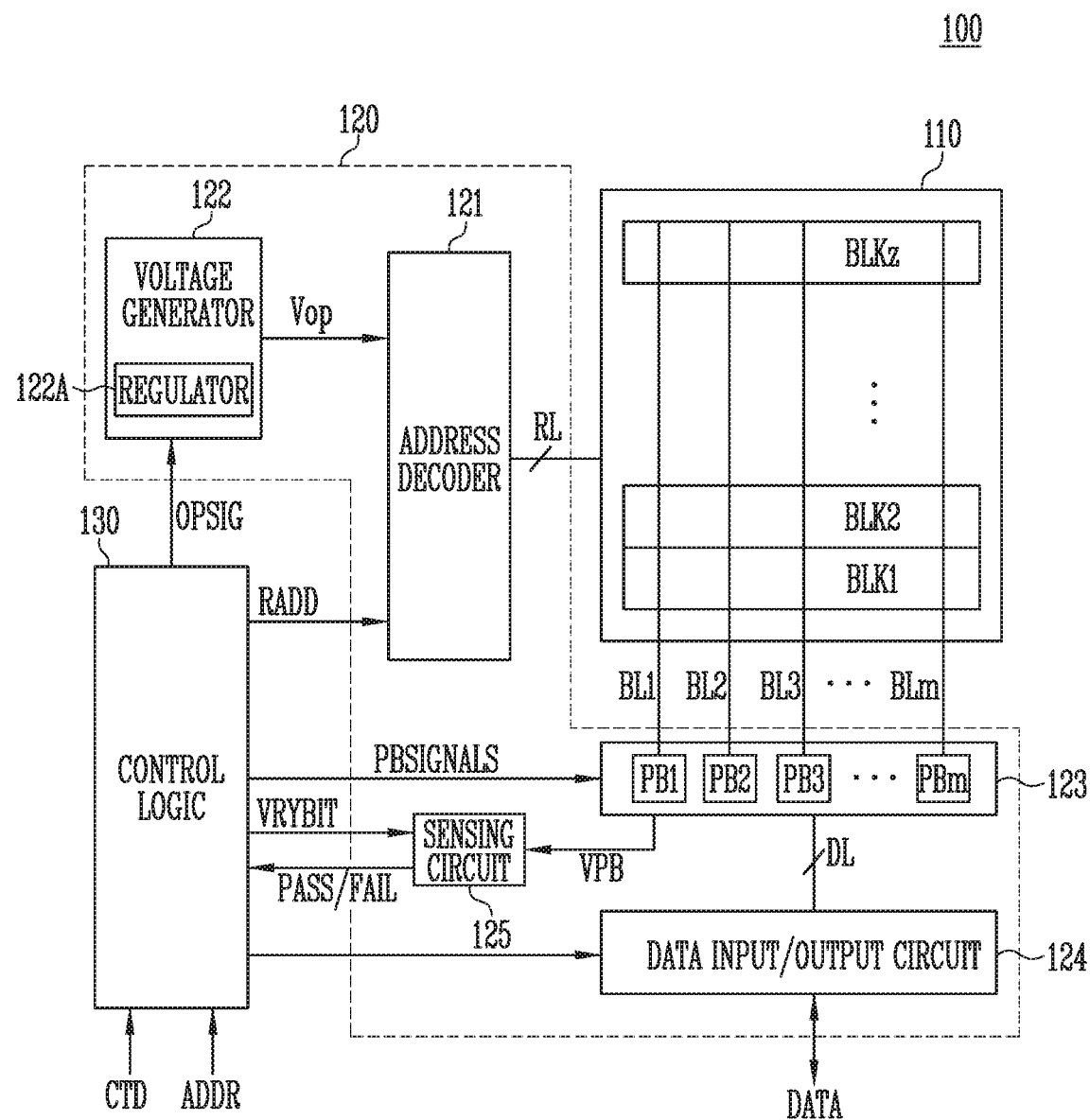

FIG. 1 is a diagram illustrating a memory device.

Figure 2:
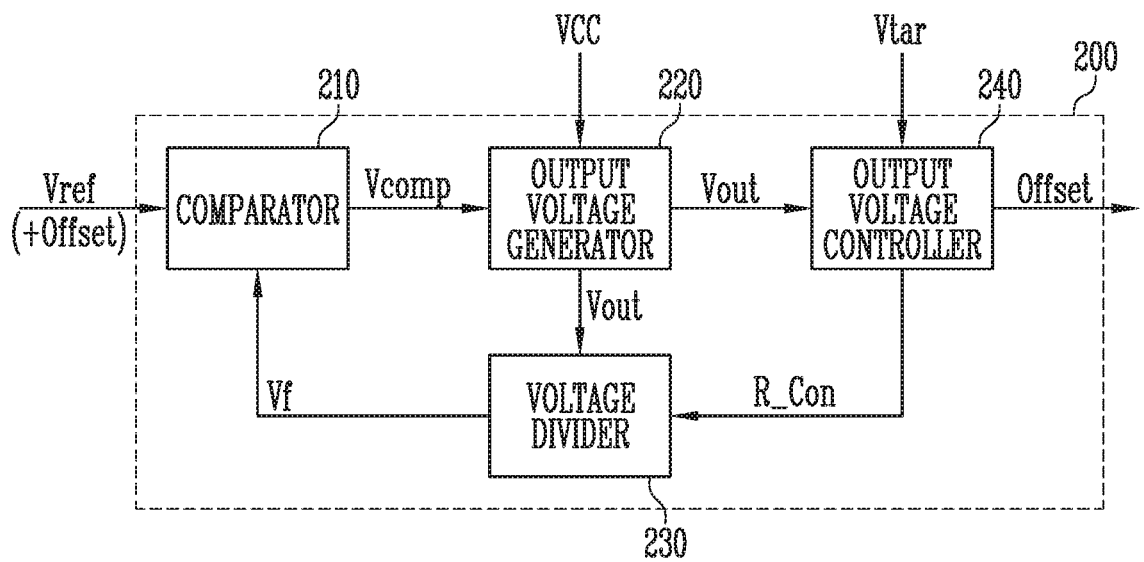

FIG. 2 is a block diagram illustrating a regulator shown in FIG. 1.

Figure 3:
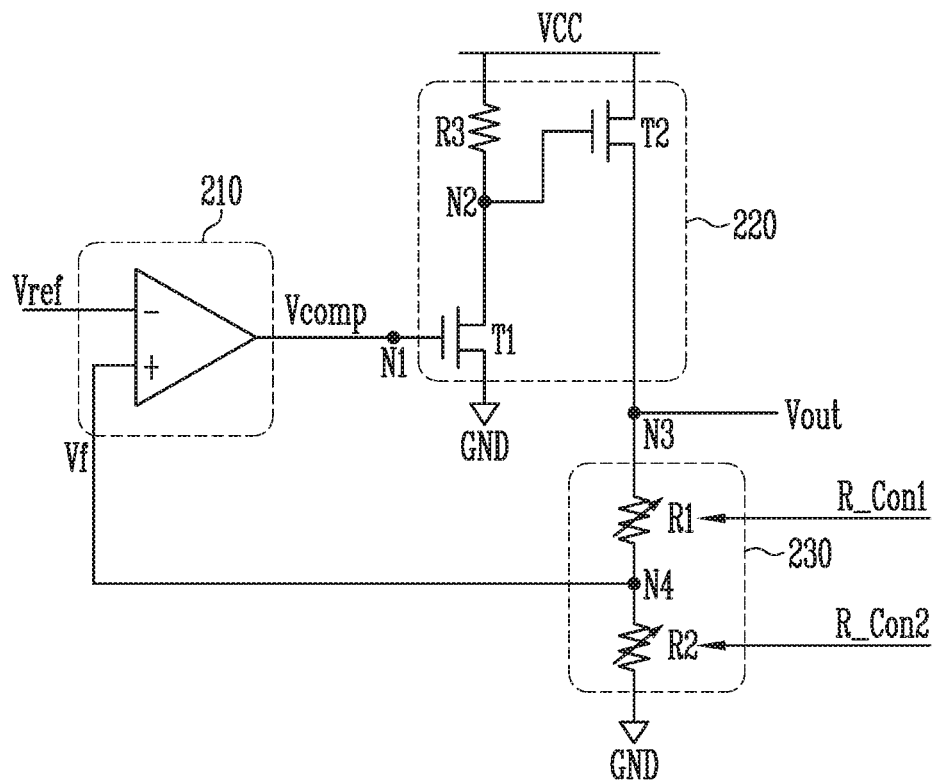

FIG. 3 is a circuit diagram illustrating a portion of the regulator shown in FIG. 2.

Figure 4:
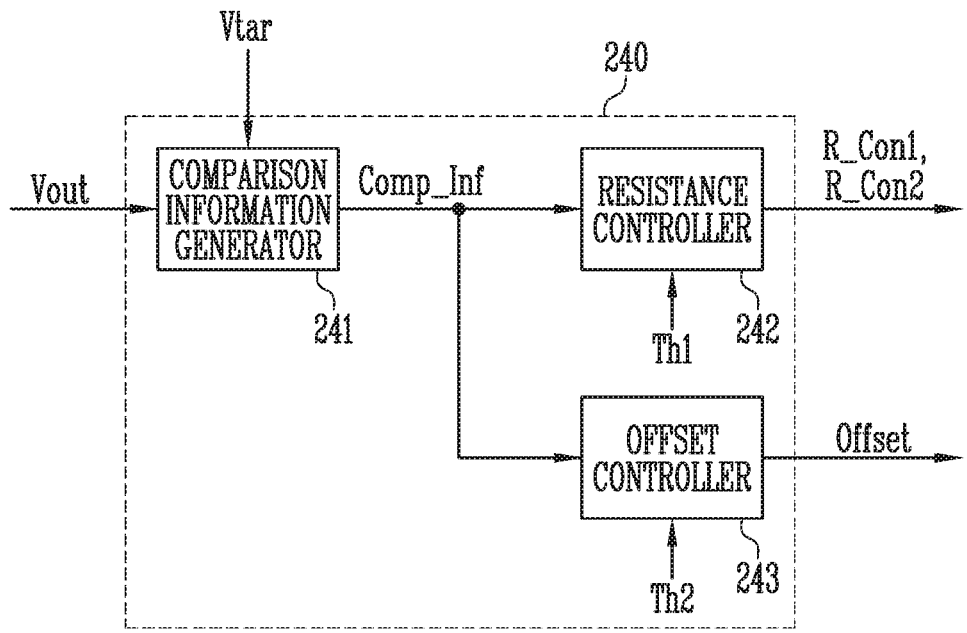

FIG. 4 is a block diagram illustrating an output voltage controller shown in FIG. 2.

Figure 5:
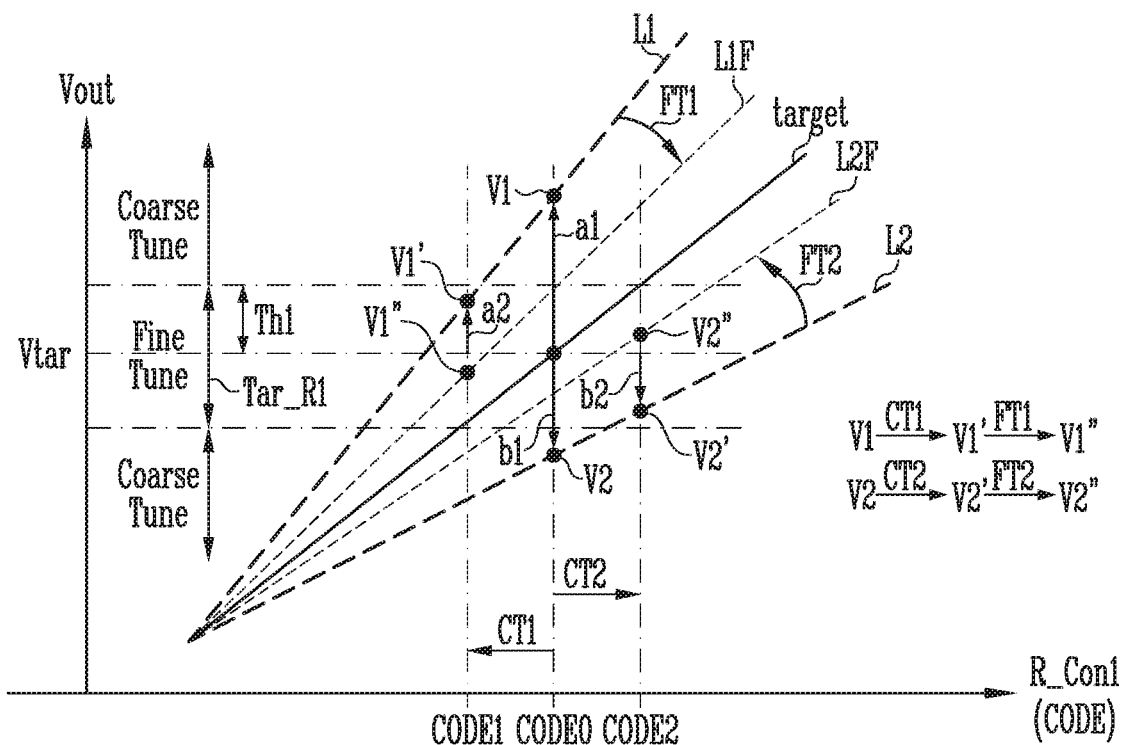

FIG. 5 is a graph illustrating an operation of the regulator in accordance with an embodiment of the present disclosure.

Figure 6:
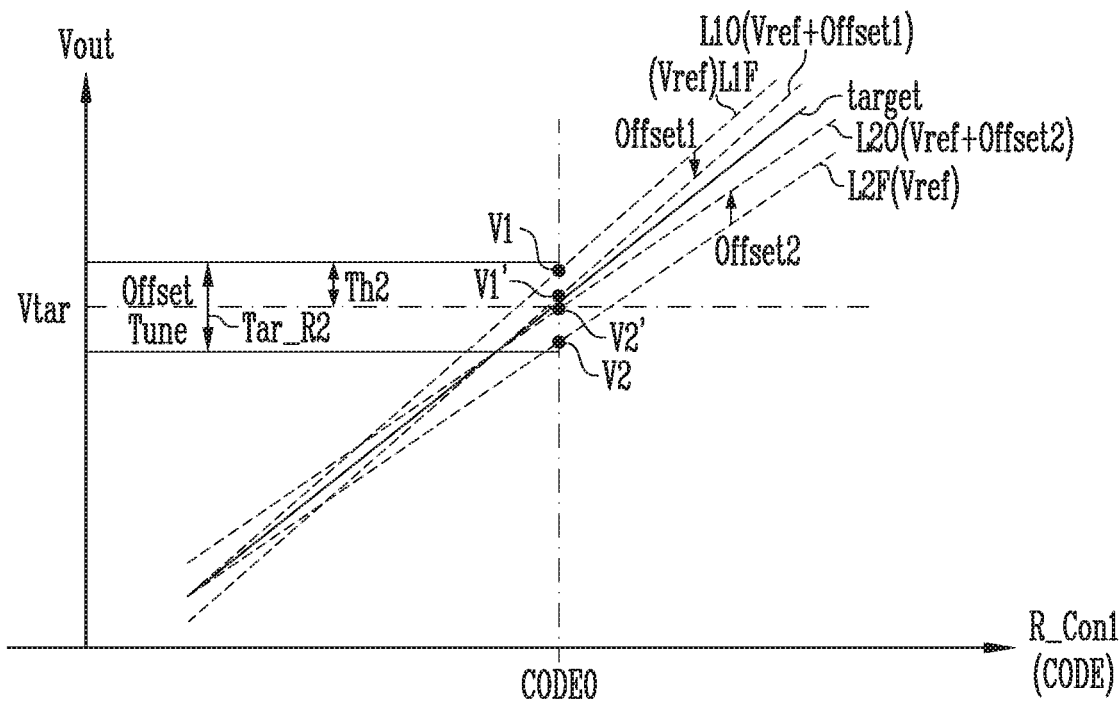

FIG. 6 is a graph illustrating an operation of the regulator in accordance with another embodiment of the present disclosure.

Figure 7:
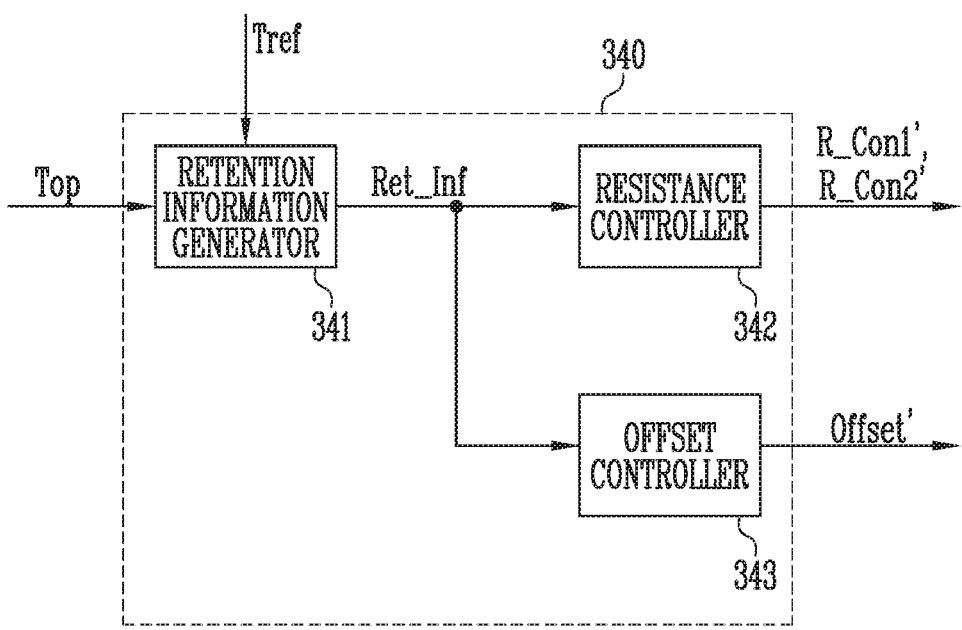

FIG. 7 is a block diagram illustrating an output voltage controller in accordance with another embodiment of the present disclosure.

DETAILED DESCRIPTION

The embodiments according to the concept of the present disclosure can be implemented in various forms, and should not be construed as limited to the embodiments set forth herein.

Hereinafter, various embodiments of the present disclosure will be described in detail with reference to the accompanying drawings.

FIG. 1 is a diagram illustrating a memory device 100.

Referring to FIG. 1, the memory device 100 may include a memory cell array 100, a peripheral circuit 120, and a control logic 130.

The peripheral circuit 120 may include an address decoder 121, a voltage generator 122, a read and write (read/write) circuit 123, a data input and output (input/output) circuit 124, and a sensing circuit 125.

The memory cell array 110 may include a plurality of memory blocks BLK1 to BLKz. The plurality of memory blocks BLK1 to BLKz may be coupled to the address decoder 121 through row lines RL. The plurality of memory blocks BLK1 to BLKz may be coupled to the read/write circuit 123 through bit lines BL1 to BLm. Each of the plurality of memory blocks BLK1 to BLKz may include a plurality of memory cells. In an embodiment, the plurality of memory cells may be nonvolatile memory cells. Memory cells coupled to the same word line among the plurality of memory cells may be defined as one physical page. That is, the memory cell array 110 may be configured with a plurality of physical pages. In some embodiments, each of the plurality of memory blocks BLK1 to BLKz in the memory cell array 110 may include a plurality of dummy cells. One or more dummy cells may be coupled in series between a drain select transistor and memory cells and between a source select transistor and the memory cells.

Each of the memory cells of the memory device may be configured as a Single Level Cell (SLC) storing one bit of data, a Multi-Level Cell (MLC) storing two bits of data, a Triple Level Cell (TLC) storing three bits of data, or a Quadruple Level Cell (QLC) storing four bits of data.

The peripheral circuit 120 drives the memory cell array 110. For example, the peripheral circuit 120 may drive the memory cell array 110 to perform a program operation, a read operation, and an erase operation.

The address decoder 121 may be coupled to the memory cell array 110 through the row lines RL. The row lines RL may include drain select lines, word lines, source select lines, and a common source line. In some embodiments, the word lines may include normal word lines and dummy word lines. In some embodiments, the row lines RL may further include a pipe select line.

The address decoder 121 may operate under the control of the control logic 130. The address decoder 121 may receive an address ADDR from the control logic 130 and may decode a block address in the received address ADDR. The address decoder 121 may select at least one memory block among the memory blocks BLK1 to BLKz according to the decoded block address. The address decoder 121 may decode a row address RADD in the received address ADDR. The address decoder 121 may select at least one word line of the selected memory block by applying voltages provided from the voltage generator 122 to the word line WL according to the decoded row address RADD.

In a program operation, the address decoder 121 may apply a program voltage to the selected word line, and apply a pass voltage having a level less than that of the program voltage to unselected word lines. In a program verify operation, the address decoder 121 may apply a verify voltage to the selected word line, and apply a verify pass voltage having a level greater than that of the verify voltage to the unselected word lines.

In a read operation, the address decoder 121 may apply a read voltage to the selected word line, and apply a read pass voltage having a level greater than that of the read voltage to the unselected word lines.

In an embodiment, an erase operation of the memory device 100 is performed in units of memory blocks. In an erase operation, the address ADDR input to the memory device 100 may include a block address. The address decoder 121 may decode the block address and select one memory block according to the decoded block address. In the erase operation, the address decoder 121 may apply a ground voltage to word lines coupled to the selected memory block.

In an embodiment, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop using an external power supply voltage supplied to the memory device 100. The voltage generator 122 operates under the control of the control logic 130.

In an embodiment, the voltage generator 122 may generate an internal power supply voltage by regulating the external power supply voltage. The internal power supply voltage generated by the voltage generator 122 is used as an operation voltage of the memory device 100.

In an embodiment, the voltage generator 122 may generate a plurality of operating voltages Vop by using the external power supply voltage or the internal power supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power supply voltage, and generate the plurality of operating voltages Vop by selectively activating the plurality of pumping capacitors under the control of the control logic 130.

In an embodiment, the voltage generator 122 may include a regulator 122A.

The regulator 122A may generate an output voltage from a power supply voltage or a high voltage obtained by pumping the power supply voltage. The generated output voltage may be used as an operating voltage Vop. The regulator 122A may generate an output voltage by using a negative feedback method such that the output voltage has a constant magnification of a reference voltage input to the regulator 122A.

The regulator 122A may finely adjust the output voltage to approach a target voltage by adjusting the resistance value of a voltage divider. The voltage divider may include at least one of a first resistor and a second resistor and will be described later with reference to FIG. 3. In various embodiments, the regulator 122A may adjust the resistance values of the first resistor and the second resistor in a constant step unit.

Specifically, the regulator 122A may adjust the magnitude of the output voltage by adjusting the resistance value of the first resistor, which is proportional to the magnitude of the output voltage. The regulator 122A may adjust an increasing rate of the output voltage by adjusting the resistance value of the second resistor, which is in inverse proportion to the increasing rate of the output voltage. The increasing rate of the output voltage may mean an increment of the magnitude of the output voltage with respect to an increment of the resistance value of the first resistor. Alternatively, the increasing rate of the output voltage may mean a decrease of the magnitude of the output voltage with respect to a decrease of the resistance value of the first resistor.

The regulator 122A may adjust the resistance value of any one of the first resistor and the second resistor, according to whether the output voltage is within a first target range determined based on a target voltage. When the output voltage is out of the first target range, the regulator 122A may adjust the resistance value of the first resistor. When the output voltage is within the first target range, the regulator 122A may adjust the resistance value of the second resistor.

The regulator 122A may determine whether the output voltage is within the first target range, by comparing the magnitude of a difference value between the output voltage and the target voltage with a first threshold difference value.

When the magnitude of the difference value is greater than the first threshold difference value, the regulator 122A may determine that the output voltage is out of the first target range. When the magnitude of the difference value is less than or equal to the first threshold difference value, the regulator 122A may determine that the output voltage is within the first target range.

The regulator 122A may adjust the resistance value of the first resistor such that the magnitude of the difference value between the output voltage and the target voltage is decreased.

For example, the regulator 122A may adjust the resistance value of the first resistor in the opposite way to a sign of the difference value. When the sign of the difference value is positive, i.e., when the output voltage is greater than the target voltage, the regulator 122A may decrease the resistance value of the first resistor. When the resistance value of the first resistor is decreased, the magnitude of the output voltage is decreased, and therefore, the magnitude of the difference value between the output voltage and the target voltage may be decreased. When the sign of the difference value is negative, i.e., when the output voltage is less than the target voltage, the regulator 122A may increase the resistance value of the first resistor. When the resistance value of the first resistor is increased, the magnitude of the output voltage is increased, and therefore, the magnitude of the difference value between the output voltage and the target voltage may be increased.

The regulator 122A may adjust the resistance value of the second resistor such that the magnitude of the difference value between the output voltage and the target voltage is decreased.

For example, the regulator 122A may adjust the resistance value of the second resistor according to the sign of the difference value. When the sign of the difference value is positive, i.e., when the output voltage is greater than the target voltage, the regulator 122A may increase the resistance value of the second resistor. When the resistance value of the second resistor is increased, the increasing rate of the output voltage may be decreased. When the increasing rate of the output voltage is decreased, the magnitude of the output voltage is decreased when the resistance value of the first resistor is equal to the previous value. Therefore, the magnitude of the difference value between the output voltage and the target voltage may be decreased. When the sign of the difference value is negative, i.e., when the output voltage is less than the target voltage, the regulator 122A may decrease the resistance value of the second resistor. When the resistance value of the second resistor is decreased, the increasing rate of the output voltage may be increased. When the increasing rate of the output voltage is increased, the magnitude of the output voltage is increased when the resistance value of the first resistor is equal to the previous value. Therefore, the magnitude of the difference value between the output voltage and the target voltage may be decreased.

The regulator 122A may adjust the reference voltage according to whether the output voltage is within a second target range determined based on the target voltage. The regulator 122A may adjust the reference voltage in a constant step unit.

When the output voltage is within the second target range, the regulator 122A may adjust the reference voltage. In another embodiment, when the output voltage is out of the second target range, the regulator 122A may adjust the reference voltage.

The regulator 122A may determine whether the output voltage is within the second target range, by comparing the magnitude of the difference value between the output voltage and the target voltage with a second threshold difference value.

When the magnitude of the difference value is greater than the second threshold difference value, the regulator 122A may determine that the output voltage is out of the second target range. When the magnitude of the difference value is less than or equal to the second threshold difference value, the regulator 122A may determine that the output voltage is within the second target range.

The regulator 122A may adjust the reference voltage in a manner that adds an offset voltage to the existing reference voltage. The regulator 122A may determine an offset voltage according to the magnitude and sign of the difference value between the output voltage and the target voltage.

The regulator 122A may adjust the reference voltage such that the magnitude of the difference value between the output voltage and the target voltage is decreased.

When the sign of the difference value is positive, the output voltage is greater than the target voltage, and therefore, the regulator 122A may add the offset voltage having a negative value to the existing reference voltage. When the sign of the difference value is negative, the output voltage is less than the target voltage, and therefore, the regulator 122A may add the offset voltage having a positive value to the existing reference voltage. The magnitude of the offset voltage added to the existing reference voltage by the regulator 122A may be determined in proportion to the magnitude of the difference value between the output voltage and the target voltage. In another embodiment, the magnitude of the offset voltage added to the existing reference voltage by the regulator 122A may be a fixed value in a constant step unit.

In an embodiment, the first target range and the second target range may be different from each other. In other words, the first threshold difference value and the second threshold difference value may be different from each other.

In an embodiment, a case in which the first target range is wider than the second target range is described below.

The regulator 122A may adjust the first resistor when the output voltage is out of the first target range. The regulator 122A may adjust the second resistor when the output voltage is within the first target range and is out of the second target range. The regulator 122A may adjust the reference voltage when the output voltage is within the second target range.

In another embodiment, a case in which the second target range is wider than the first target range is described below.

The regulator 122A may adjust the reference voltage when the output voltage is out of the second target range. The regulator 122A may adjust the first resistor when the output voltage is within the second target is range and is out of the first target range. The regulator 122A may adjust the second resistor when the output voltage is within the first target range.

Alternatively, the regulator 122A may individually adjust the resistance values of the first and second resistors and the reference voltage. In other words, the regulator 122A may independently perform an operation of adjusting the resistance value of the resistor according to whether the output voltage is within the first target range and an operation of adjusting the reference voltage according to whether the output voltage is within the second target range.

The plurality of voltages flop generated by the voltage generator 122 may be supplied to the memory cell array 110 through the address decoder 121.

The read/write circuit 123 may include first to mth page buffers PB1 to PBm. The first to mth page buffers PB1 to PBm may be coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power supply voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 may output, to the external controller, data which is transmitted from the first to mth page buffers PB1 is to PBm included in the read/write circuit 123.

In a read operation or verify operation, the sensing circuit 125 may generate a reference current in response to an allow bit VRYBIT signal generated by the control logic 130. Further, the sensing circuit 125 may output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may control overall operations of the memory device 100. The control logic 130 may operate in response to a command CMD received from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

FIG. 2 is a block diagram illustrating a regulator 200 corresponding to the regulator shown in FIG. 1.

Referring to FIG. 2, the regulator 200 may include a comparator 210, an output voltage generator 220, a voltage divider 230, and an output voltage controller 240.

The comparator 210 may generate a comparison voltage Vcomp by comparing a reference voltage Vref and a feedback voltage Vf.

For example, the comparator 210 may generate the comparison voltage Vcomp in proportion to the magnitude of a difference value between the reference voltage Vref and the feedback voltage Vf. In various embodiments, the comparator 210 may generate the comparison voltage Vcomp having any one of a low level and a high level, based on a result obtained by comparing the reference voltage Vref and the feedback voltage Vf. Specifically, when the feedback voltage Vf is greater than the reference voltage Vref, the comparator 210 may generate the comparison voltage Vcomp having the high level. When the feedback voltage Vf is less than the reference voltage Vref, the comparator 210 may generate the comparison voltage Vcomp having the low level.

The output voltage generator 220 may receive a power supply voltage VCC and generate an output voltage Vout by using the power supply voltage VCC, based on the comparison voltage Vcomp. The output voltage generator 220 may adjust the magnitude of the generated output voltage Vout according to the comparison voltage Vcomp. In various embodiments, the output voltage generator 220 may generate the output voltage Vout by using a high voltage obtained by pumping the power supply voltage VCC, instead of the power supply voltage VCC.

The voltage divider 230 may generate the feedback voltage Vf by dividing the output voltage Vout. The voltage divider 230 may include first and second resistors for voltage division. The voltage divider 230 may include another equivalent resistance circuit in addition to the first and second resistors.

Resistance values of the first and second resistors may be adjusted by a resistance control signal R_Con provided by the output voltage controller 240. The voltage divider 230 may divide the output voltage Vout such that the output voltage Vout has a constant magnification of the feedback voltage Vf. When the feedback voltage Vf is tuned to the reference voltage Vref, the output voltage Vout may be output to have a constant magnification of the reference voltage Vref.

The output voltage controller 240 may compare the output voltage Vout with a target voltage Vtar. In an embodiment, the target voltage Vtar may be input from outside of the memory device to adjust the output voltage Vout of the regulator 200. The input of the target voltage Vtar is not limited to this embodiment. In various embodiments, the target voltage Vtar may be generated from an internal voltage generation circuit included in the voltage generator 122 shown in FIG. 1.

Further, the output voltage controller 240 may generate the resistance control signal R_Con for adjusting the resistance values of the resistors in the voltage divider 230 and an offset voltage Offset for adjusting the reference voltage, based on the comparison result. A new reference voltage Vref obtained by adding the offset voltage Offset to the existing reference voltage Vref may be input to the comparator 210.

The output voltage controller 240 may determine whether the output voltage Vout is within a first target range determined based on the target voltage. Specifically, when the magnitude of a difference value between the output voltage Vout and the target voltage is greater than a first threshold difference value, the output voltage controller 240 may determine that the output voltage Vout is out of the first target range. When the magnitude of the difference value is less than or equal to the first threshold difference value, the output voltage controller 240 may determine that the output voltage Vout is within the first target range.

When the output voltage Vout is out of the first target range, the output voltage controller 240 may generate the resistance control signal R_Con for adjusting the resistance value of the first resistor of the voltage divider 230. The resistance value of the first resistor may be in proportion to the magnitude of the output voltage Vout. When the output voltage Vout is within the first target range, the output voltage controller 240 may generate the resistance control signal R_Con for adjusting the resistance value of the second resistor of the voltage divider 230. The resistance value of the second resistor may be in inverse proportion to an increasing rate of the output voltage Vout.

The output voltage controller 240 may determine whether the output voltage Vout is within a second target range determined based on the target voltage. Specifically, when the magnitude of the difference value between the output voltage Vout and the target voltage is greater than a second threshold difference value, the output voltage controller 240 may determine that the output voltage Vout is out of the second target range. When the magnitude of the difference value is less than or equal to the second threshold difference value, the output voltage controller 240 may determine that the output voltage Vout is within the second target range.

When the output voltage Vout is within the second target range, the output voltage controller 240 may generate the offset voltage Offset for adjusting the reference voltage Vref. In another embodiment, when the output voltage Vout is out of the second target range, the output voltage controller 240 may generate the offset voltage Offset for adjusting the reference voltage Vref.

In an embodiment, the first target range and the second target range may be different from each other. In other words, the first threshold difference value and the second threshold difference value may be different from each other.

The output voltage controller 240 may finely adjust the output voltage Vout to match the target voltage by using the resistance control signal R_Con and the offset voltage Offset. That is, the output voltage controller 240 may generate the resistance control signal R_Con and the offset voltage Offset in a direction in which the magnitude of the difference value between the output voltage Vout and the target voltage Vtar is decreased. The output voltage controller 240 may independently perform an operation of adjusting the resistance value of the resistor and an operation of adjusting the offset voltage Offset.

In various embodiments, the output voltage controller 240 may adjust the resistance values of the resistors of the voltage divider 230 in a constant step unit through the resistance control signal R_Con. The output voltage controller 240 may adjust the reference voltage Vref in a constant step unit through the offset voltage Offset.

FIG. 3 is a circuit diagram illustrating a portion of the regulator 200 shown in FIG. 2.

Referring to FIG. 3, the comparator 210 may receive a reference voltage Vref and a feedback voltage Vf, to generate a comparison voltage Vcomp.

The comparator 210 may generate the comparison voltage Vcomp in proportion to the magnitude of a difference value between the reference voltage Vref and the feedback voltage Vf. In various embodiments, the comparator 210 may generate the comparison voltage Vcomp having any one of a low level and a high level, based on a result obtained by comparing the reference voltage Vref and the feedback voltage Vf. Specifically, when the feedback voltage Vf is greater than the reference voltage Vref, the comparator 210 may generate the comparison voltage Vcomp having the high level. When the feedback voltage Vf is less than the reference voltage Vref, the comparator 210 may generate the comparison voltage Vcomp having the low level.

The output voltage generator 220 may include a first transistor T1 as a first switching circuit, a second transistor T2 as a second switching circuit, and a third resistor R3.

The first transistor T1 may be controlled according to a potential of a first control node N1. A gate terminal of the first transistor T1 and an output terminal of the comparator 210 may be coupled to the first control node N1. The first transistor T1 may be coupled between a second control node N2 and a ground voltage terminal GND. The first transistor T1 may be configured as a NMOS transistor. In another embodiment, the first transistor T1 may be configured as a PMOS transistor.

The third resistor R3 may be coupled between a power supply voltage terminal and the second control node N2. A power supply voltage VCC or a high voltage Vpp obtained by pumping the power supply voltage VCC may be applied to the power supply voltage terminal.

The second transistor T2 may be controlled according to a potential of the second control node N2. A gate terminal of the second transistor T2 may be coupled to the second control node N2. The second transistor T2 may be coupled between the power supply voltage terminal and an output node N3 through which an output voltage Vout is output. The second transistor T2 may be configured as a NMOS transistor. In another embodiment, the second transistor T2 may be configured as a PMOS transistor.

In an embodiment, the output voltage generator 220 may generate the output voltage Vout by using the power supply voltage VCC and/or the high voltage Vpp obtained by pumping the power supply voltage VCC, based on the comparison voltage Vcomp. The output voltage generator 220 may adjust the magnitude of the output voltage Vout according to the comparison voltage Vcomp.

When the comparison voltage Vcomp has the low level, the first transistor T1 may be turned off. When the first transistor T1 is turned off, a current path from the second control node N2 to the ground voltage terminal CND is blocked. Therefore, the second control node N2 may be floated, and the potential of the second control node N2 may be increased to the high level due to influence of the power supply voltage VCC applied through the third resistor R3. When the potential of the second control node N2 is increased to a level greater than that of a threshold voltage of the second transistor T2, the second transistor T2 may be turned on. When the second transistor T2 is turned on, a current path from the power supply voltage terminal to the output node N3 is formed. A potential of the output node N3 is increased as an amount of current flowing from the second control node N2 to the output node N3 is increased. Therefore, the output voltage generator 220 may generate the output voltage Vout having a higher level.

When the comparison voltage Vcomp has the high level, the first transistor T1 may be turned on. When the first transistor T1 is turned on, the current path from the second control node N2 to the ground voltage terminal GND is formed. Therefore, the potential of the second control node N2 may be decreased to a ground voltage level. When the potential of the second control node N2 is decreased to the ground voltage level, the second transistor T2 may be turned off. When the second transistor T2 is turned off, the current path from the power supply voltage terminal to the output node N3 is blocked. The potential of the output node N3 is decreased as the amount of current flowing from the second control node N2 to the output node N3 is decreased. Therefore, the output voltage generator 220 may generate the output voltage having a lower level.

The voltage divider 230 may include a first resistor R1 and a second resistor R2.

The first resistor R1 and the second resistor R2 may generate the feedback voltage Vf by dividing the output voltage Vout. The first resistor R1 may be coupled between the output node N3 and a feedback node N4 through which the feedback voltage Vf is output. The second resistor R2 may be coupled between the feedback node N4 and the ground voltage terminal GND.

Each of the first resistor R1 and the second resistor R2 may be a variable resistor. A resistance value of the first resistor R1 may be adjusted according to a first resistance control signal R_Con1 provided by the output voltage controller 240 described with reference to FIG. 2. A resistance value of the second resistor R2 may be adjusted according to a second resistance control signal R_Con2 provided by the output voltage controller 240.

A magnitude of the output voltage Vout, which is proportional to the resistance value of the first resistor R1, may be adjusted according to the first resistance control signal R_Con1. An increasing rate of the output voltage Vout, which is in inverse proportion to the resistance value of the second resistor R2, may be adjusted according to the second resistance control signal R_Con2. The increasing rate of the output voltage Vout may mean an increment of the magnitude of the output voltage Vout with respect to an increment of the resistance value of the first resistor R1. Alternatively, the increasing rate of the output voltage Vout may mean a decrease of the magnitude of the output voltage Vout with respect to a decrease of the resistance value of the first resistor R1.

In various embodiments, the voltage divider 230 may include an equivalent resistance circuit (not shown) reflecting resistance values of other circuit elements.

The voltage divider 230 may generate the feedback voltage Vf in proportion to the magnitude of the output voltage Vout. The feedback voltage Vf is input as an input voltage of the comparator 210, so that a negative feedback can be performed.

When the output voltage generator 240 generates the output voltage Vout having a relatively high level, the voltage divider 230 may generate the feedback voltage Vf having a relatively high level. When the feedback voltage having a level greater than that of the reference voltage Vref is input to the comparator 210, the comparator 210 may generate the comparison voltage Vcomp having the high level. As described above, when the comparison voltage Vcomp has the high level, the output voltage generator 240 may generate the output voltage Vout having a level less than the previous level.

When the output voltage generator generates the output voltage Vout having a relatively low level, the voltage divider 230 may generate the feedback voltage Vf having a relatively low level. When the feedback voltage Vf having a level less than that of the reference voltage Vref is input to the comparator 210, the comparator 210 may generate the comparison voltage Vcomp having the low level. As described above, when the comparison voltage Vcomp has the low level, the output voltage generator 240 may generate the output voltage Vout having a level greater than the previous level.

Due to the negative feedback described above, the feedback voltage Vf can be tuned to the same level as the reference voltage Vref, and the output voltage Vout can be output to have a constant magnification of the reference voltage Vref.

FIG. 4 is a block diagram illustrating the output voltage controller shown in FIG. 2.

Referring to FIG. 4, the output voltage controller 240 may include a comparison information generator 241, a resistance controller 242, and an offset controller 243.

The comparison information generator 241 may receive an output voltage Vout and a target voltage Vtar, and generate comparison information Comp_Inf. The comparison information Comp_Inf may represent a difference value between the output voltage Vout and the target voltage Vtar. The comparison information Comp_Inf may include information on a magnitude of the difference value and information on a sign of the difference value.

The resistance controller 242 may adjust the resistance of at least one of the first resistor R1 and the second resistor R2, which constitute the voltage divider 230 shown in FIG. 3. A magnitude of the output voltage Vout may be in proportion to the resistance value of the first resistor R1. An increasing rate of the output voltage Vout may be in inverse proportion to the resistance value of the second resistor R2. In various embodiments, the resistance controller 242 may adjust the resistance values of the first resistor R1 and the second resistor R2 in a constant step unit.

The resistance controller 242 may generate a first resistance control signal R_Con1 for adjusting the resistance value of the first resistor R1. The resistance controller 242 may generate a second resistance control signal R_Con2 for adjusting the resistance value of the second resistor R2.

In various embodiment, the first resistance control signal R_Con1 and the second resistance control signal R_Con2 may be configured with digital codes. The resistance value of the first resistor R1 may be increased or decreased according to a code value of the first resistance control signal R_Con1. The resistance value of the second resistor R2 may be increased or decreased according to a code value of the second resistance control signal R_Con2.

The resistance controller 242 may adjust the resistance value of any one of the first resistor R1 and the second resistor R2, according to whether the output voltage Vout is within a first target range determined based on the target voltage Vtar. When the output voltage Vout is out of the first target range, the resistance controller 242 may adjust the resistance value of the first resistor R1 through the first resistance control signal R_Con1. When the output voltage Vout is within the first target range, the resistance controller 242 may adjust the resistance of the second resistor R2 through the second resistance control signal R_Con2.

The resistance controller 242 may determine whether the output voltage Vout is within the first target range, based on the comparison information Comp_Inf. Specifically, the resistance controller 242 may determine whether the output voltage Vout is within the first target range, by comparing the magnitude of the difference value between the output voltage Vout and the target voltage Vtar with a first threshold difference value Th1. Information on the first threshold difference value Th1 may be provided to the resistance controller 242.

When the magnitude of the difference value between the output voltage Vout and the target voltage Vtar is greater than the first threshold difference value Th1, the resistance controller 242 may determine that the output voltage Vout is out of the first target range. When the magnitude of the difference value is less than or equal to the first threshold difference value Th1, the resistance controller 242 may determine that the output voltage Vout is within the first target range.

The resistance controller 242 may adjust the resistance value of the first resistor R1 in a direction in which the magnitude of the difference value between the output voltage Vout and the target voltage Vtar is decreased.

For example, the resistance controller 242 may adjust the resistance value of the first resistor R1 in the opposite way to the sign of the difference value between the output voltage Vout and the target voltage Vtar. When the sign of the difference value is positive, i.e., the resistance controller 242 may decrease the resistance value of the first resistor R1. When the resistance value of the first resistor R1 is decreased, the magnitude of the output voltage Vout is decreased, therefore, the magnitude of the difference value between the output voltage Vout and the target voltage Vtar may be decreased. When the sign of the difference value is negative, the resistance controller 242 may increase the resistance value of the first resistor R1. When the resistance value of the first resistor R1 is increased, the magnitude of the output voltage Vout is increased, therefore, the magnitude of the difference value between the output voltage Vout and the target voltage Vtar may be increased.

The resistance controller 242 may adjust the resistance value of the second resistor R2 in a direction in which the magnitude of the difference value between the output voltage Vout and the target voltage Vtar is decreased.

For example, the resistance controller 242 may adjust the resistance value of the second resistor R2 according to the sign of the difference value. When the sign of the difference value is positive, i.e., when the output voltage Vout is greater than the target voltage Vtar, the resistance controller 242 may increase the resistance value of the second resistor R2. When the resistance value of the second resistor R2 is increased, the increasing rate of the output voltage Vout may be decreased. When the increasing rate of the output voltage Vout is decreased, the magnitude of the output voltage Vout is decreased when the resistance value of the first resistor R1 is equal to the previous value. Therefore, the magnitude of the difference value between the output voltage Vout and the target voltage Vtar may be decreased.

When the sign of the difference value is negative, i.e., when the output voltage Vout is less than the target voltage Vtar, the resistance controller 242 may decrease the resistance value of the second resistor R2. When the resistance value of the second resistor R2 is decreased, the increasing rate of the output voltage Vout may be increased. When the increasing rate of the output voltage Vout is increased, the magnitude of the output voltage Vout is increased when the resistance value of the first resistor R1 is equal to the previous value. Therefore, the magnitude of the difference value between the output voltage Vout and the target voltage Vtar may be decreased.

The offset controller 243 may adjust the reference voltage Vref described with reference to FIG. 3, according to whether the output voltage Vout is within a second target range determined based on the target voltage Vtar. The offset controller 243 may adjust the reference voltage Vref in a constant step unit.

When the output voltage Vout is within the second target range, the offset controller 243 may adjust the reference voltage Vref. In another embodiment, when the output voltage Vout is out of the second target range, the offset controller 243 may adjust the reference voltage Vref.

The offset controller 243 may determine whether the output voltage Vout is within the second target range, based on the comparison information Comp_Inf. Specifically, the offset controller 243 may determine whether the output voltage Vout is within the second target range, by comparing the magnitude of the difference value between the output voltage Vout and the target voltage Vtar with a second threshold difference value Th2. Information on the second threshold difference value Th2 may be provided to the offset controller 243.

When the magnitude of the difference value between the output voltage Vout and the target voltage Vtar is greater than the second threshold difference value Th2, the offset controller 243 may determine that the output voltage Vout is out of the second target range. On the contrary, when the magnitude of the difference value is less than or equal to the second threshold difference value Th2, the offset controller 243 may determine that the output voltage Vout is within the second target range.

In an embodiment, the offset controller 243 may generate an offset voltage Offset, and adjust the reference voltage Vref in a manner that adds the generated offset voltage Offset to the existing reference voltage. In another embodiment, the offset controller 243 may adjust the reference voltage Vref in a manner that generates offset information on the offset voltage Offset to be reflected to the existing reference voltage and provides the offset information to the voltage generator.

The offset controller 243 may adjust the reference voltage Vref in a direction in which the magnitude of the difference value between the output voltage Vout and the target voltage Vtar is decreased. The offset controller 243 may determine the offset voltage Offset according to the magnitude and sign of the difference value between the output voltage Vout and the target voltage Vtar.

When the sign of the difference value between the output voltage Vout and the target voltage Vtar is positive, the output voltage Vout is greater than the target voltage Vtar, therefore, the offset controller 243 may add the offset voltage Offset having a negative value to the reference value Vref. When the sign of the difference value is negative, the output voltage Vout is less than the target voltage Vtar, therefore, the offset controller 243 may add the offset voltage Offset having a positive value to the reference voltage Vref.

A magnitude of the offset voltage Offset added to the existing reference voltage by the offset controller 243 may be determined in response to the magnitude of the difference value. In another embodiment, the magnitude of the offset voltage Offset added to the existing reference voltage by the offset controller 243 may be a fixed value in a constant step unit.

In an embodiment, the first target range and the second target range may be different from each other. In other words, the first threshold difference value Th1 and the second threshold difference value Th2 may be different from each other.

In various embodiments, a case in which the first target range is wider than the second target range is described. Information on the second threshold difference value Th2 may be provided to the resistance controller 242.

When the output voltage Vout is out of the first target range, the resistance controller 242 may adjust the resistance value of the first resistor R1. When the output voltage Vout is within the first target range and is out of the second target range, the resistance controller 242 may adjust the resistance value of the second resistor R2. When the output voltage Vout is within the second target range, the offset controller 243 may adjust the reference voltage Vref.

In another embodiment, a case in which the second target range is wider than the first target range is described. Information of the second threshold difference value Th2 may be provided to the resistance controller 242.

When the output voltage Vout is out of the second target range, the offset controller 243 may adjust the reference voltage Vref. When the output voltage Vout is within the second target range and is out of the first target range, the resistance controller 242 may adjust the resistance value of the first resistor R1. When the output voltage Vout is within the first target range, the resistance controller 242 may adjust the resistance value of the second resistor R2.

In various embodiments, an operation of adjusting, by the resistance controller 242, the resistance value according to whether the output voltage Vout is within the first target range and an operation of adjusting, by the offset controller 243, the reference voltage according to whether the output voltage Vout is within the second target range may be independently performed.

FIG. 5 is a graph illustrating an operation of the regulator 200 in accordance with an embodiment of the present disclosure.

Referring to FIG. 5, the horizontal axis of the graph may represent a code value of a first resistance control signal R_Con1. The vertical axis of the graph may represent output voltage Vout.

When the code value of the first resistance signal R_Con1 is a zeroth code CODE0, the output voltage Vout of a target line target may be a target voltage Vtar.

In an embodiment, an operation of the regulator 200 for adjusting the resistance values of the first and second resistors described with reference to FIG. 3 such that the output voltage Vout approaches the target voltage Vtar, when the output voltage Vout is greater than the target voltage Vtar, will be described.

When the code value of the first resistance signal R_Con1 is the zeroth code CODE0, the output voltage Vout of a line L1 may be a voltage V1.

At least one of the first resistor R1 and the second resistor R2 may be selectively adjusted according to whether the voltage V1 is within a first target range Tar_R1. Whether the voltage V1 is within the first target range Tar_R1 may be determined based on a result obtained by comparing is the magnitude (i.e., the length of a1) of a difference value between the voltage V1 and the target voltage Vtar with a first threshold difference value Th1.

Since the magnitude (i.e., the length of a1) of the difference value between the voltage V1 and the target voltage Vtar is greater than the first threshold difference value Th1, the voltage V1 is out of the first target range Tar_R1. Since the voltage V1 is out of the first target range Tar_R1, the resistance value of the first resistor R1 may be adjusted in a direction in which the magnitude of a difference value between the output voltage Vout and the target voltage Vtar is decreased. The process of adjusting the resistance value of the first resistor R1 may be a process of coarse-tuning the output voltage Vout.

Since the sign (i.e., the direction of a1) of the difference value is positive, the resistance value of the first resistor R1 may be adjusted to be decreased so as to decrease the magnitude of the output voltage Vout. Therefore, in first coarse tuning CT1, the code value of the first resistance control signal R_Con1 may be decreased from the zeroth code CODE0 to a first code CODE1. While the code value of the first resistance control signal R_Con1 is being decreased from the zeroth code CODE0 to the first code CODE1, the output voltage Vout of the line L1 may be adjusted from the voltage V1 to a voltage V1'. Through the first coarse tuning CT1, the output voltage Vout may come closer to the target voltage Vtar.

When the code value of the first resistance control signal R_Con1 is the first code CODE1, the output voltage Vout of the line L1 may be the voltage V1'.

Since the magnitude (i.e., the length of a2) of a difference value between the voltage V1' and the target voltage Vtar is less than the first threshold difference value Th1, the voltage V1' is within the first target range Tar_R1 Since the voltage V1' is within the first target range Tar_R1, the resistance of the second resistor may be adjusted in a direction in which the difference value between the output voltage Vout and the target voltage Vtar is decreased. The process of adjusting the resistance of the second resistor R2 may be a process of fine-tuning the output voltage Vout.

An increasing rate of the output voltage Vout may be adjusted according to the resistance value of the second resistor R2. The increasing rate of the output voltage Vout may be in inverse proportion to the resistance value of the second resistor R2.

Since the sign (i.e., the direction of a2) of the difference value is positive, the resistance value of the second resistor R2 may be adjusted to increase so as to decrease the magnitude of the output voltage Vout. Therefore, in first fine tuning FT1, a code value of a second resistance control signal may be further increased than the previous value, and the increasing rate of the output voltage Vout may be decreased from the line L1 to a line L1F. While the increasing rate of the output voltage Vout is being decreased from the line L1 to the line L1F, the output voltage Vout may be adjusted from the voltage V1' to a voltage V1" when the code value of the first resistance control signal R_Con1 is the first code CODE1 equal to the previous value.

Consequently, through the first coarse tuning CT1 and the first fine tuning FT1, the output voltage Vout can be adjusted from the voltage V1 to the voltage V1", and come closer to the target voltage Vtar.

In an embodiment, an operation of the regulator 200 for adjusting the resistance values of the first and second resistors such that the output voltage Vout approaches the target voltage Vtar, when the output voltage Vout is less than the target voltage Vtar, will be described.

When the code value of the first resistance control signal R_Con1 is the zeroth code CODE0, the output voltage Vout of a line L2 may be a voltage V2.

At least one of the first resistor R1 and the second resistor R2 may be selectively adjusted according to whether the voltage V2 is within the first target range Tar_R1. Whether the voltage V2 is within the first target range Tar_R1 may be determined based on a result obtained by comparing the magnitude of a difference value between the voltage V2 and the target voltage Vtar with the first threshold difference value Th1.

Since the magnitude (i.e., the length of b1) of the difference value between the voltage V2 and the target voltage Vtar is greater than the first threshold difference value Th1, the voltage V2 is out of the first target range Tar_R1. Since the voltage V2 is out of the first target range Tar_R1, the resistance value of the first resistor R1 may be adjusted in a direction in which the magnitude of the difference value between the output Vout and the target voltage Vtar is decreased. The process of adjusting the resistance value of the first resistor R1 may be a process of coarse-tuning the output voltage Vout.

Since the sign (i.e., the direction of b1) of the difference value is negative, the resistance of the first resistor R1 may be adjusted to increase so as to increase the magnitude of the output voltage Vout. Therefore, in second coarse tuning CT2, the code value of the first resistance control signal R_Con1 may be increased from the zeroth code CODE0 to a second code CODE2. While the code value of the first resistance control signal R_Con1 is being increased from the zeroth code CODE0 to the second code CODE2, the output voltage Vout of the line L2 may be adjusted from the voltage V2 to a voltage V2'. Through the second coarse tuning CT2, the output voltage may come closer to the target voltage Vtar.

When the code value of the first resistance control signal R_Con1 is the second code CODE2, the output voltage Vout of the line L2 may be the voltage V2'.

Since the magnitude (i.e., the length of b2) of a difference value between the voltage V2' and the target voltage Vtar is less than the first threshold difference value Th1, the voltage V2' is within the first target range Tar_R1. Since the voltage V2' is within the first target range Tar_R1, the resistance value of the second resistor R2 may be adjusted in a direction in which the magnitude of the difference value between the output voltage Vout and the target voltage Vtar is decreased. The process of adjusting the resistance value of the second resistor R2 may be a process of fine-tuning the output voltage Vout.

Since the sign (i.e., the direction of b2) of the difference value is negative, the resistance of the second resistor R2 may be adjusted to decrease so as to increase the magnitude of the output voltage Vout. Therefore, in second fine tuning FT2, the code value of the second resistance control signal may be further decreased than the previous value, and the increasing rate of the output voltage Vout may be increased from the line L2 to a line L2F. While the increasing rate of the output voltage Vout is being increased from the line L2 to the line L2F, the output voltage Vout may be adjusted from the voltage V2' to a voltage V2" when the code value of the first resistance control signal R_Con1 is the second code CODE2 equal to the previous value.

Consequently, through the second coarse tuning CT2 and the second fine tuning FT2, the output voltage Vout can be adjusted from the voltage V2 to the voltage V2", and come closer to the target voltage Vtar.

FIG. 6 is a graph illustrating an operation of the regulator 200 in accordance with another embodiment of the present disclosure.

Referring to FIG. 6, the horizontal axis of the graph may represent code value of a first resistance control signal R_Con1. The vertical axis of the graph may represent output voltage Vout.

When the code value of the first resistance signal R_Con1 is a zeroth code CODE0, and a reference voltage is a voltage Vref, the output voltage Vout of a target line target may be a target voltage Vtar.

In an embodiment, an operation of the regulator 200 for adjusting the reference voltage described with reference to FIG. 3 such that the output voltage Vout approaches the target voltage Vtar, when the output voltage Vout is greater than the target voltage Vtar, will be described.

When the code value of the first resistance signal R_Con1 is the zeroth code CODE0, the output voltage Vout of a line L1F may be a voltage V1. The line L1F may be a line of which output voltage Vout has an adjusted increasing rate, which is described with reference to FIG. 5.

The reference voltage Vref may be adjusted according to whether the output voltage Vout is within a second target range Tar_R2. In an embodiment, when the output voltage Vout is within the second target range Tar_R2, the reference voltage Vref may be adjusted. In another embodiment, when the output voltage Vout is out of the second target range Tar_R2, the reference voltage Vref may be adjusted.

Since the magnitude of a difference value between the voltage V1 and the target voltage Vtar is less than a second threshold difference value Th2, the voltage V1 is within the second target range Tar_R2. Since the voltage V1 is within the second target range Tar_R2, the reference voltage Vref may be adjusted in a direction in which the magnitude of the difference value between the output voltage Vout and the target voltage Vtar is decreased.

A process of adjusting the reference value by adding an offset voltage Offset to the reference voltage Vref may be a process of offset-tuning the output voltage Vout. The offset voltage Offset is added to the existing reference voltage, so that the line of the output voltage Vout may be moved in parallel on the vertical axis of the graph, while the increasing rate of the output voltage Vout is being equally maintained. That is, although the resistance value of the first resistor R1 and the resistance value of the second resistor R2 are equal to the previous values, the reference voltage Vref is adjusted by adding the offset voltage Offset to the reference voltage Vref, so that the magnitude of the output voltage Vout can be adjusted.

Since the sign of the difference value between the voltage V1 and the target voltage Vtar is positive, the reference voltage Vref may be adjusted to decrease so as to decrease the magnitude of the output voltage Vout. Therefore, a first offset voltage Offset1 having a negative value may be added to the existing reference voltage. While the reference voltage is being adjusted from the existing voltage Vref to a voltage (Vref+Offset1), the line of the output voltage Vout may be moved in parallel from the line L1F to a line L1O.

Thus, through offset tuning, the output voltage Vout is adjusted from the voltage V1 to a voltage V1', and the output voltage Vout can come closer to the target voltage Vtar.

In an embodiment, an operation of the regulator 200 for adjusting the reference voltage Vref such that the output voltage Vout approaches to the target voltage Vtar, when the output voltage Vout is less than the target voltage Vtar, will be described.

When the code value of the first resistance signal R_Con1 is the zeroth code CODE0, the output voltage Vout of a line L2F may be a voltage V2. The line L2F may be a line of which output voltage Vout has an adjusted increasing rate.

Since the magnitude of a difference value between the voltage V2 and the target voltage Vtar is less than a second threshold difference value Th2, the voltage V2 is within a second target range Tar_R2. Since the voltage V2 is within the second target range Tar_R2, the reference voltage Vref may be adjusted in a direction in which the magnitude of the difference value between the output voltage Vout and the target voltage Vtar is decreased.

Since the sign of the difference value between the voltage V2 and the target voltage Vtar is negative, the reference voltage Vref may be adjusted to increase so as to increase the magnitude of the output voltage Vout. Therefore, a second offset voltage Offset2 having a positive value may be added to the reference voltage Vref. While the reference voltage is being adjusted from the voltage Vref to a voltage (Vref+Offset2), the line of the output voltage Vout may be moved in parallel from the line L2F to a line L2O.

Thus, through offset tuning, the output voltage Vout is adjusted from the voltage V2 to a voltage V2', and the output voltage Vout can come closer to the target voltage Vtar.

FIG. 7 is a block diagram illustrating an output voltage controller 340 in accordance with another embodiment of the present disclosure.

Referring to FIG. 7, the output voltage controller 340 is another embodiment of the output voltage controller 240 described with reference to FIG. 4.

The output voltage controller 340 may include a retention information generator 341, a resistance controller 342, and an offset controller 343.

The retention information generator 341 may receive an operation time Top of a memory device and a reference time Tref, compare the operation time Top with the reference time Tref and generate retention information Ret_Inf. The retention information Ret_Inf may represent a degree of degradation of memory cells. The operation time Top may include any one of an average read time, an average erase time, and an average program time of the memory device. The reference time Tref may be a predetermined time. In various embodiments, the retention information Ret_Inf may be implemented with a digital code.

When the operation time Top is less than or equal to the reference time Tref, the retention information generator 341 may generate the retention information Ret_Inf having a default value. When the operation time Top is greater than the reference time Tref, the retention information generator 341 may generate the retention information Ret_Inf having a value in proportion to a difference value between the operation time Top and the reference time Tref.

When the retention information Ret_Inf has a value greater than the default value, the degree of degradation of the memory cells considerably progresses, and therefore, an operating voltage having a level greater that that when the retention information Ret_Inf has the default value is required to stably operate the memory device.

The resistance controller 342 may adjust the magnitude of an output voltage, based on the retention information Ret_Inf. Specifically, when the retention information Ret_Inf has a value greater than the default value, the resistance controller 342 may adjust the resistance value of at least one of the first resistor R1 and the second resistor R2 of the voltage divider of FIG. 3 such that the magnitude of the output voltage is further increased than the previous value.

In the same manner as the resistance controller 242 shown in FIG. 4, the resistance controller 342 may adjust the magnitude of the output voltage by adjusting the resistance value of the at least one resistor. For example, to increase the magnitude of the output voltage, the resistance controller 342 may increase the resistance value of the first resistor R1 through a first resistance control signal R_Con1' or decrease the resistance value of the second resistor R2 through a second resistance control signal R_Con2'.

The offset controller 343 may adjust the magnitude of the output voltage Vout, based on the retention information Ret_Inf. Specifically, when the retention information Ret_Inf has a value greater than the default value, the offset controller 343 may adjust a reference voltage Vref such that the magnitude of the output voltage Vout is further increased than the previous magnitude.

In the same manner as the offset controller 243 shown in FIG. 4, the offset controller 343 may adjust the reference voltage Vref. For example, the offset controller 343 may adjust the magnitude of the output voltage Vout to increase in a manner that adds an offset voltage Offset' having a positive value in a constant step unit to the reference voltage Vref.

In accordance with the present disclosure, there can be provided a regulator having improved voltage control capability and a memory device having the regulator.

While the present invention has been shown and described with reference to certain specific embodiments thereof, it will be understood by those skilled in the art that various changes in form and details may be made therein without departing from the spirit and scope of the present invention as defined by the appended claims and their equivalents. Therefore, the scope of the present invention should not be limited to the above-described embodiments but should be determined by the appended claims including also equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, various embodiments of the present disclosure have been described in the drawings and specification. Although specific terms are used herein, the terms are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A regulator comprising:
a comparator configured to generate a comparison voltage by comparing a reference voltage with a feedback voltage;
an output voltage generator configured to generate an output voltage by using a power supply voltage, based on the comparison voltage;
a voltage divider including a first resistor and a second resistor, which generate the feedback voltage by dividing the output voltage; and
an output voltage controller configured to adjust a resistance value of at least one of the first resistor and the second resistor, based on a result of comparing the output voltage with a target voltage.

2. The regulator of claim 1, wherein the output voltage controller adjusts the resistance value of the at least one resistor, according to whether the output voltage is within a first target range determined based on the target voltage.

3. The regulator of claim 1, wherein the output voltage controller includes:
a comparison information generator configured to generate comparison information representing a difference value between the output voltage and the target voltage;
a resistance controller configured to determine whether the output voltage is within a first target range, based on the comparison information, and adjust the resistance value of the at least on resistor, based on the determination result; and
an offset controller configured to adjust the reference voltage according to whether the output voltage is within a second target range determined based on the target voltage.

4. The regulator of claim 3, wherein the resistance controller determines whether the output voltage is within the first target range, by comparing a magnitude of the difference value with a first threshold value.

5. The regulator of claim 3, wherein the resistance controller adjusts the resistance value of the first resistor, when the output voltage is out of the first target range.

6. The regulator of claim 5, wherein the resistance controller adjusts the resistance value of the first resistor such that the magnitude of the difference value is decreased.

7. The regulator of claim 3, wherein the resistance controller adjusts the resistance value of the second resistor, when the output voltage is within the first target range.

8. The regulator of claim 7, wherein the resistance controller adjusts the resistance value of the second resistor such that the magnitude of the difference value is decreased.

9. The regulator of claim 3, wherein the resistance controller adjusts the resistance value of the at least one resistor by using a digital code.

10. The regulator of claim 3, wherein, when the output voltage is within the second target range, the offset controller adds, to the reference voltage, an offset voltage determined according to a magnitude and a sign of the difference value.

11. The regulator of claim 3, wherein the second target range is different from the first target range.

12. The regulator of claim 1, wherein the first resistor is coupled between a node of the output voltage and a node of the feedback voltage, and
the second resistor is coupled between the node of the feedback voltage and a terminal of a ground voltage.

13. The regulator of claim 1, wherein the comparator is configured to generate the comparison voltage having one of a low level and a high level, based on the result of comparing the output voltage and the target voltage.

14. The regulator of claim 1, wherein the comparator is configured to generate the comparison voltage in proportion to a magnitude of a difference value between the reference voltage and the feedback voltage.

15. The regulator of claim 1, wherein the output voltage generator includes:
a first switching circuit configured to adjust a voltage of a control node according to the comparison voltage; and
a second switching circuit configured to adjust an amount of current flowing from a terminal of the power supply voltage to a node of the output voltage, according to the voltage of the control node.

16. The regulator of claim 15, wherein the output voltage generator further includes a third resistor coupled between the terminal of the power supply voltage and the control node,
wherein the first switching circuit is coupled between the control node and a terminal of a ground voltage, and
the second switching circuit is coupled between the terminal of the power supply voltage and the node of the output voltage.

17. A memory device comprising:
a memory cell array including a plurality of memory cells;
a peripheral circuit configured to perform an operation on the plurality of memory cells;
a voltage generator configured to generate an operating voltage for the operation; and
a control logic configured to control the peripheral circuit and the voltage generator,
wherein the voltage generator includes a regulator configured to generate the operating voltage by using a power supply voltage, and adjust at least one of a resistance value of a first resistor, which is proportional to a magnitude of the operating voltage, and a resistance value of a second resistor, which is in inverse proportion to an increasing rate of the operating voltage, by comparing the operating voltage with a target voltage.

18. The memory device of claim 17, wherein the regulator includes:
a comparator configured to generate a comparison voltage by comparing a reference voltage with a feedback voltage;
an output voltage generator configured to generate the operating voltage by using the power supply voltage, based on the comparison voltage;
a voltage divider including a first resistor and a second resistor, which generate the feedback voltage by dividing the operating voltage; and
an output voltage controller configured to adjust a resistance value of at least one of the first resistor and the second resistor, according to whether a difference value between the operating voltage and the target voltage is within a target range.

19. The memory device of claim 18, wherein the output voltage controller adjusts the resistance value of the first resistor when a magnitude of the difference value is out of the target range, and adjusts the resistance value of the second resistor when the magnitude of the difference value is within the target range.

20. The memory device of claim 18, wherein the output voltage controller adjusts the reference voltage according to whether the output voltage is within a second target range determined based on the target voltage.

* * * * *